(12) United States Patent
Matsumoto

(10) Patent No.: US 7,358,776 B2
(45) Date of Patent: Apr. 15, 2008

(54) SIGNAL DETECTION CIRCUIT AND SIGNAL DETECTION METHOD

(75) Inventor: Yuji Matsumoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 89 days.

(21) Appl. No.: 10/948,568

(22) Filed: Sep. 24, 2004

(65) Prior Publication Data

US 2005/0248369 A1 Nov. 10, 2005

(30) Foreign Application Priority Data

May 7, 2004 (JP) ............................. 2004-138245

(51) Int. Cl.
*G01R 19/00* (2006.01)
*H03K 5/19* (2006.01)
(52) U.S. Cl. .......................................... 327/18; 327/65
(58) Field of Classification Search ............ 327/18–21, 327/63, 65; 330/252–253
See application file for complete search history.

(56) References Cited

U.S. PATENT DOCUMENTS

| 5,789,925 A * | 8/1998 | Yokotani et al. ............. 324/500 |
| 6,617,883 B1 * | 9/2003 | Kuhn .............................. 327/3 |
| 2003/0132803 A1 * | 7/2003 | Matsumoto et al. ......... 330/253 |
| 2004/0008597 A1 * | 1/2004 | Tanaka et al. ........... 369/53.25 |
| 2005/0184804 A1 * | 8/2005 | Matsuda ..................... 330/253 |

FOREIGN PATENT DOCUMENTS

| JP | 3-54922 | 3/1991 |
| JP | 2002-344541 | 11/2002 |

OTHER PUBLICATIONS

Behzad Razavi, "Design of Analog CMOS Integrated Circuits," ISBN 4-621-07220-X C 3055, Mar. 30, 2003, pages: cover, title, 20, 156, 157.

* cited by examiner

*Primary Examiner*—Quan Tra
(74) *Attorney, Agent, or Firm*—Arent Fox LLP

(57) ABSTRACT

It is intended to provide a signal detection circuit and a signal detection method capable of preventing influences of variations in transistor characteristics, occurrence of yield degradations of the signal detection circuit and capable of detecting differential input signals at high speed. The signal detection circuit 4 comprises an amplifier section 1, a comparator section 2, and an output section 3. Differential input signals and differential reference voltages are differential-amplified by differential amplifiers 10, 11 of identical circuit structure provided in the amplifier section 1. The relationship of degree between differential input signals and differential reference voltages after differential amplification are compared in comparators 12 and 13 of the comparator section 2. High level comparison result signals CPH are output from the comparator 12 through node N6 during period in which at least one of amplified data plus signals GDP and amplified data minus signals GDM is higher than amplified high reference voltages GRH. In an integration circuit 21, integration of comparison signals COMP is performed for performing noise eliminating operations and for outputting detection signals HS_ENV_OUT.

9 Claims, 11 Drawing Sheets

DIAGRAM SHOWING SIGNAL DETECTION CIRCUIT 4 DIRECTED TO PRESENT INVENTION

FIG. 1 DIAGRAM SHOWING SIGNAL DETECTION CIRCUIT 4 DIRECTED TO PRESENT INVENTION

DIAGRAM SHOWING SPECIFIC EXAMPLE OF CIRCUIT STRUCTURE OF SIGNAL DETECTION CIRCUIT 4 DIRECTED TO PRESENT INVENTION

FIG. 4 CIRCUIT DIAGRAM OF RAIL-TO-RAIL AMPLIFIER

DIAGRAM OF INTEGRATION OPERATION SECTION 17a DIRECTED TO THIRD EMBODIMENT

DIAGRAM OF INTEGRATION OPERATION SECTION 17b DIRECTED TO THIRD EMBODIMENT

TIMING CHART FOR ILLUSTRATING OPERATION OF INTEGRATION OPERATION SECTION 17b DIRECTED TO THIRD EMBODIMENT

FIG. 8 CIRCUIT DIAGRAM OF RAIL-TO-RAIL AMPLIFIER 30p

FIG. 9  CIRCUIT DIAGRAM OF AMPLIFIER SECTION 1a

DIAGRAM OF CONVENTIONAL COMPARATOR SECTION 102

CIRCUIT DIAGRAM OF CONVENTIONAL GILBERT CELL CIRCUIT 104

SIGNAL DETECTION CIRCUIT AND SIGNAL DETECTION METHOD

CROSS-REFERENCE TO RELATED APPLICATIONS

This application is based upon and claims the benefit of priority from each of the prior Japanese Patent Application No. 2004-138245 filed on May 7, 2004, the entire contents of which are incorporated herein by reference.

BACKGROUND OF THE INVENTION

1. Field of the Invention

The present invention relates to detection of input signals using data receivers, and particularly to a signal detection circuit and a signal detection method for detecting presence or absence of differential input signals.

2. Description of Related Art

In data receivers of serial buses employing differential input signals, circuits for detecting presence or absence of input of differential input signals might be required. A signal detection method might in such a case be a method in which it is judged that no signal is present when an amplitude value of a differential voltage of a differential input signal is less than a reference voltage value and that a signal is present when this value is not less than the reference voltage value. A conventional signal detection circuit 100, which is a circuit for performing the above operations, is shown in FIG. 10.

The signal detection circuit 100 comprises an amplifier section 101 and a comparator section 102. The comparator 102 is provided with a Gilbert cell circuit 104 and a comparator circuit 105. The Gilbert cell circuit 104 is provided with differential amplifiers 112 and 113 of four input and two output structure. Data plus signals DP, data minus signals DM, high reference voltages RH and low reference voltages RL are respectively differential-amplified through the amplifier section 101 to become amplified data plus signals GDP, amplified data minus signals GDM, amplified high reference voltages GRH and amplified low reference voltages GRL, respectively, whereupon these are input to the differential amplifiers 112 and 113. Here, the data plus signals DP and data minus signals DM are differential input signals. Further, the high reference voltages RH and low reference voltages RL are reference voltages that are respectively set to specified values.

A diagram in which the Gilbert cell circuit 104 is shown as a specific example of a circuit structure is shown in FIG. 11. The Gilbert cell circuit 104 comprises a first Gilbert cell 120, a second Gilbert cell 121, a first amplifier section 122, and a second amplifier section 123. In the first Gilbert cell 120, amplified data plus signals GDP that are input to a gate of a transistor M101 and amplified data minus signals GDM that are input to a gate of a transistor M103 are compared. Further, amplified high reference voltages GRH that are input to a gate of a transistor M102 are compared with amplified low reference voltages GRL that are input to a gate of a transistor M104. Here, since drain terminals of the transistors M101 and M102 and drain terminals of the transistors M103 and M104 are connected in the first Gilbert cell 120, current adding is performed. With this arrangement, a sum of respective results of comparison is obtained. The results of comparison obtained from the current sum in the first Gilbert cell 120 are output as amplified signals NN1, NN2 that have been converted into voltage in the first amplifier section 122. By performing the same operations in the second Gilbert cell 121, amplified signals NN3 and NN4 are output from the second amplifier section 123.

In FIG. 10, the amplified signals NN1 to NN4 are input to the comparator circuit 105. The comparator circuit 105 is provided with comparators 114 and 115. The amplified signals NN1 and NN2 are input to a non-inversed input terminal and an inversed input terminal of the comparator 114 while comparison result signals CPH1 are output from the comparator 114. The amplified signals NN3 and NN4 are input to a non-inversed input terminal and an inversed input terminal of the comparator 115 while comparison result signals CPL1 are output from the comparator 115. The presence or absence of input signals to the data receiver is detected on the basis of the results of the comparison result signals CPH1 and the comparison result signals CPL1.

SUMMARY OF THE INVENTION

However, since the Gilbert circuit 104 comprised by the conventional comparator section 102 is provided with a large number of circuits that require symmetry of transistors such as the current mirrors as shown in FIG. 11, it is easily affected by variations in transistor performances so that the performance tends to be degraded. Accordingly, the performance of the present signal detection circuit might to be constrained by performance variations of the Gilbert cell circuit 104 or improvements in the yield of the signal detection circuit might become difficult by being constrained by the yield of the Gilbert cell circuit 104. Moreover, the Gilbert cell circuit 104 is arranged in that differential voltage is converted into current for current adding whereupon it is repeatedly converted into voltage. This will require some time for the conversion between voltage and current so that the speed will be limited, and this might lead to a problem in that the amplitudes of input signal voltages with respect to transmission and receipt of differential input signals at high speed (for instance, a high speed mode of USB 2.0 standard (480 Mbps)) so that it might be impossible to detect the presence or absence of input signals.

The present invention has been made to solve at least one of the above subjects of the prior art, and it is an object thereof to provide a signal detection circuit and a signal detection method that is capable of preventing occurrence of variations in signal detection performance owing to influences of variations in transistor performances and occurrence of degradations in the yield of the signal detection circuit and that is capable of corresponding to input of differential input signals at high speed.

For achieving this object, the signal detection circuit according to the present invention is a signal detection circuit for detecting presence or absence of input of differential input signals comprising an amplifier section for differential-amplifying differential reference voltages and the differential input signals, and a comparator section provided with at least either one of a first comparator circuit for performing detection upon input of a high reference voltage of the differential reference voltage after differential amplification and the differential input signal after differential amplification when at least either one of output signals of the differential input signals is higher than the high reference voltage, and a second comparator circuit for performing detection input of a low reference voltage of the differential reference voltage and the differential input signals when at least either one of output signals from the differential input signals is lower than the low reference voltage.

The differential reference voltage is a reference voltage comprised of binary voltage values, that is, the high reference voltage and the low reference voltage. One of the voltage values of the differential reference voltages may be of ground level. The comparator section compares the degree of the differential voltage values for the differential reference voltages and the amplitude values of the differential input signals, and outputs the result of such comparison. The comparator section comprises at least either one a first comparator circuit and a second comparator circuit. The first comparator circuit detects a case in which at least either one of the differential input signals is higher than the high reference voltage. The second comparator circuit detects a case in which at least either one of the differential input signals is lower than the low reference voltage.

With this arrangement, by detecting a case in which the differential output signal is higher than the high reference voltage or a case in which it is lower than the low reference voltage, it is possible to perform comparison of the degree of the differential voltage values of the differential reference voltages and the amplitude values of the differential input signals and to detect the presence or absence of differential input signals. In this respect, the presence or absence of differential input signals can be detected also in case either one of the comparator circuits, that is, the first comparator circuit and the second comparator circuit, is provided, and such an arrangement will be of advantage in that it is possible to achieve simplification of the circuit.

BRIEF DESCRIPTION OF THE DRAWINGS

FIG. 9 is a circuit diagram of an amplifier section 1a;

DETAILED DESCRIPTION OF THE PREFERRED EMBODIMENTS

Figure 1:
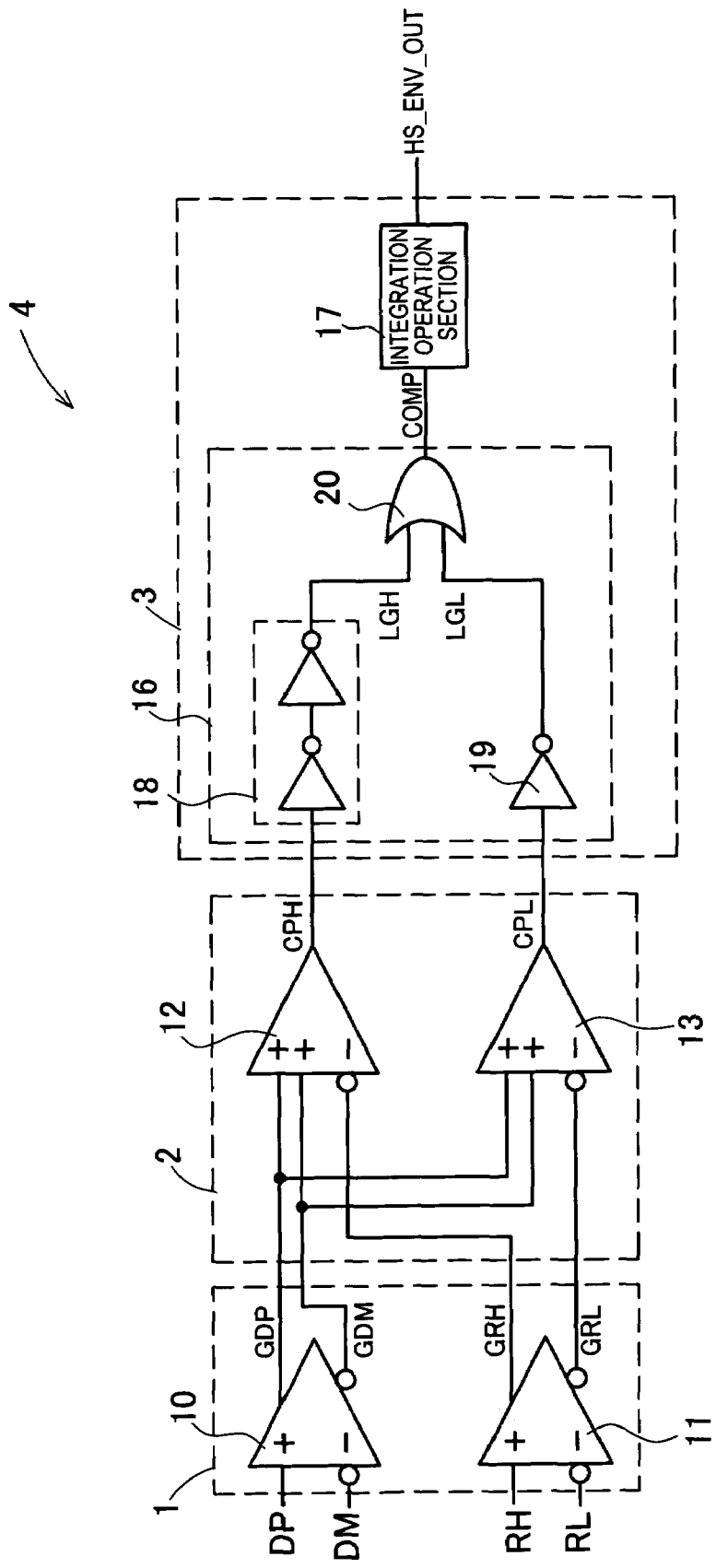
FIG. 1 is a diagram showing a signal detection circuit 4 directed to the present invention.

Embodiments embodying the signal detection circuit of the present invention will now be explained in details on the basis of FIGS. 1 to 8 while referring to the drawings. The first embodiment of the present invention will be explained by using FIGS. 1 to 3. The signal detection circuit 4 of the present invention as illustrated in FIG. 1 comprises an amplifier section 1, a comparator section 2, and an output section 3. The amplifier section 1 is provided with differential amplifiers 10 and 11. To the differential amplifier 10, differential input signals (data plus signal DP and data minus signal DM) are input. The data plus signal DP is input to a non-inversed input terminal of the differential amplifier 10 while the data minus signal DM is input to an inversed input terminal thereof. From the differential amplifier 10, differential output signals that have been differential-amplified (amplified data plus signal GDP and amplified data minus signal GDM) are output. Further, high reference voltage RH is input to a non-inversed input terminal of the differential amplifier 11 and low reference voltage RL is input to an inversed input terminal thereof. From the differential amplifier 11, amplified high reference voltage GRH and amplified low reference voltage GRL that have been differential-amplified are output.

The comparator section 2 is provided with comparators 12 and 13 of three input and one output type. The amplified data plus signal GDP and amplified data minus signal GDM are input to non-inversed input terminals of the comparator 12 and amplified high reference voltage GRH is input to an inversed input terminal thereof. From the comparator 12, comparison result signal CPH is output. The amplified data plus signal GDP and amplified data minus signal GDM are input to non-inversed input terminals of the comparator 13 and amplified low reference voltage GRL is input to an inversed input terminal thereof. From the comparator 13, comparison result signal CPL is output.

The output section 3 is provided with a signal conversion section 16 and an integration operation section 17. The signal conversion section 16 is provided with a buffer 18 comprised of a two-staged inverter and a buffer 19 comprised of a single-staged inverter, and output ends of the respective buffers are connected to an OR gate 20. The comparison result signal CPH input to the buffer 18 is output as logic signal LGH upon wave shaping, and comparison result signal CPL input to the buffer 19 is output as logic signal LGL upon wave shaping and inversion. The logic signals LGH, LGL are input to the OR gate 20, and comparison signal COMP is output from the OR gate 20. The comparison signal COMP is input to the integration operation section 17, and detection signal HS_ENV_OUT is output from the integration operation section 17.

The detection signal HS_ENV_OUT is signal that is used for noticing signal detection. In, for instance, a bus transceiver of USB 2.0 standard, it is used as Squelch signal, wherein it is recognized by an USB receiver that input of effective signal is present when the Squelch signal is of low level while it is recognized that no input of effective signals is present when it is of high level.

Operations of the signal detection circuit 4 will now be explained. Comparison result signal CPH of high level is output from the comparator 12 during a period in which at least one of the amplified data plus signal GDP and amplified data minus signal GDM is higher than the amplified high reference voltage GRH. Comparison result signal CPL of low level is output from the comparator 13 during a period in which at least one of the amplified data plus signal GDP and amplified data minus signal GDM is lower than the amplified low reference voltage GRL. The comparison result signal CPH and comparison result signal CPL are input to the signal conversion section 16. In the buffers 18, 19 provided in the signal conversion portion 16, the comparison result signals CPH and CPL of analogous waveforms undergo wave-shaping to become logic signals LGH and LGL. The logic signals LGH and LGL that are input to the OR gate 20 are synthesized, and comparison signal COMP is output from the OR gate 20. In the integration operation section 17, noise is eliminated through integration of the comparison signal COMP, and detection signal HS_ENV_OUT is output from the integration operation section 17.

Figure 2:
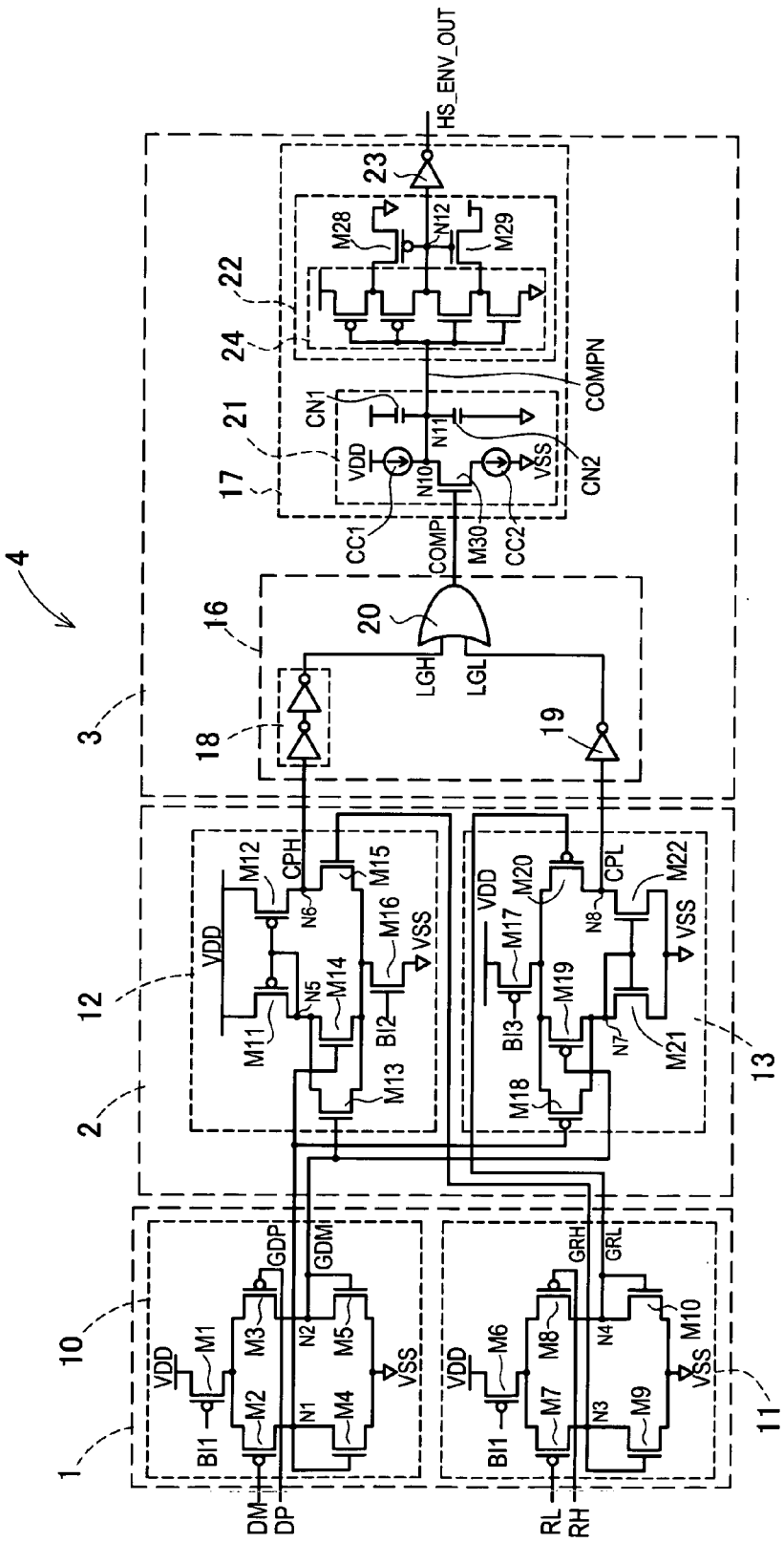
FIG. 2 is a diagram showing a specific example of a circuit structure of the signal detection circuit 4 directed to the present invention.

A diagram in which FIG. 1 is illustrated as a specific circuit structure example is illustrated in FIG. 2. The differential amplifier 10 and the differential amplifier 11 provided in the amplifier section 1 are comprised to be of the same circuit structure with transistors of the same size. The differential amplifier 10 and the differential amplifier 11 are driven upon applying bias B11 to transistor M1 and transistor M6.

The differential amplifier 10 is comprised with PMOS transistors M1 to M3, and NMOS transistors M4 and M5. A source of the transistor M1 is connected to a power source VDD and a drain of the transistor M1 is connected to sources of the transistors M2 and M3 in common. Drains of the transistors M4, M5 are respectively connected to the drains of the transistors M2, M3 through nodes N1, N2. Sources of the transistors M4, M5 are connected a power source VSS. The data minus signal DM is input to a gate of the transistor M2 and data plus signal DP is input to a gate of the transistor M3. A gate of the transistor M4 is connected to the node N1, and a gate of the transistor M5 is connected to the node N2. The nodes N1, N2 are connected to both of the comparators 12 and 13 of the comparator section 2. By applying bias B11 to the transistor M1, differential-amplifying operations are performed in the differential amplifier 10, and differential voltages of the data plus signal DP and data minus signal DM are differential-amplified. Amplified data plus signal GDP is then output from the node N1 and amplified data minus signal GDM is output from the node N2, respectively.

The differential amplifier 11 is comprised of transistors M6 to M10 having a size that is completely identical to that of the transistors M1 to M5 of the differential amplifier 10, and the circuit structure is also identical. Accordingly, explanations thereof will be omitted here. To a gate of the transistor M7, low reference voltage RL is input, and to a gate of the transistor M8, high reference voltage RH is input. Nodes N3 and N4 are connected to both of the comparators 12 and 13 of the comparator section 2. By applying bias B11 to the transistor M6, differential-amplifying operations are performed in the differential amplifier 11, and differential voltages of the high reference voltage RH and the low reference voltage RL are differential-amplified. Amplified high reference voltage GRH is then output from the node N3 and amplified low reference voltage GRL is output from the node N4, respectively.

The comparator 12 is comprised with PMOS transistors M11 and M12 and NMOS transistors M13 to M16. Sources of the transistors M11 and M12 are connected to the power source VDD. A drain of the transistor M11 is connected to drains of the transistors M13 and M14 through a node N5 in common. A drain of the transistor M12 is connected to a drain of the transistor M15 through a node N6. In this respect, the transistors M13 to M15 are transistors of identical size and identical characteristics. A drain of the transistor M16 is connected to sources of the transistors M13 to M15 in common, and a source of the transistor M16 is connected to the power source VSS. Amplified data minus signal GDM is input to the gate of the transistor M13 and amplified data plus signal GDP is input to the gate of the transistor M14. Since the node N5 is connected to the gates of the transistors M11 and M12 in common, an active load is comprised through a current mirror circuit in the transistors M11 and M12. The node N6 is connected to a buffer 18, and voltage of the node N6 is input to the buffer 18 as comparison result signal CPH. By applying bias BI2 to the transistor M16, comparison operations are performed in the comparator 12. In this respect, signal input to the transistors M13 and M14 may be performed also in an opposite manner, that is, in that amplified data plus signal GDP is input to the gate of the transistor M13 and in that amplified data minus signal GDM is input to the gate of the transistor M14.

The comparator 13 comprises PMOS transistors M17 to M20 and NMOS transistors M21, M22. A source of the transistor M17 is connected to the power source VDD and a drain thereof is connected to sources of the transistors M18 to M20 in common. Drains of the transistors M18 and M19 are connected to a drain of the transistor M21 through a node N7 in common. A drain of the transistor M20 is connected to a drain of the transistor M22 through a node N8. Sources of the transistors M21, M22 are connected to the power source VSS in common. Amplified data plus signal GDP is input to the gate of the transistor M18 while amplified data minus signal GDM is input to the gate of the transistor M19, and amplified low reference voltage GRL is input to the gate of the transistor M20. In this respect, the transistors M18 to M20 are transistors of identical size and of identical characteristics. Since the node 7 is connected to the gates of the transistors M21 and M22 in common, an active load is comprised through a current mirror circuit. The node N8 is connected to a buffer 19, and voltage of the node N8 is input to the buffer 19 as comparison result signal CPL. By applying bias B13 to the transistor M17, comparison operations are performed in the comparator 13. In this respect, signal input to the transistors M18 and M19 may be performed also in an opposite manner, that is, in that amplified data minus signal GDM is input to the gate of the transistor M18 and in that amplified data plus signal GDP is input to the gate of the transistor M19.

The output section 3 is comprised with the signal conversion section 16 and the integration operation section 17. In the signal conversion section 16, output ends of the buffer 18 and the buffer 19 are connected to the input end of the OR gate 20. Logic signals LGH and LGL are output from the buffers 18, 19. An output end of the OR gate 20 is connected to a transistor M30 of the output section 3, and comparison signal COMP output from the OR gate 20 is input to a gate of the transistor M30.

The integration operation section 17 is comprised with an integration circuit 21, a Schmitt trigger circuit 22 and an inverter 23. In the integration circuit 21, a drain of the transistor M30 is connected to a power source VDD through a node N10 and a constant current source CC1, and current is made to flow from the power source VDD in the direction of the transistor M30. A source of the transistor M30 is connected to a power source VSS through a constant current source CC2, and current is made flow from the transistor M30 in the direction of the power source VSS. The node N10 is connected to a node N11. The node N11 is connected to the power source VDD through a capacitor CN1 and is also connected to the power source VSS through a capacitor CN2. A voltage of the node N11 is defined to be integrated comparison signal COMPN and is input to the Schmitt trigger circuit 22. The Schmitt trigger circuit 22 is arranged in that it comprises a PMOS transistor M28 and a NMOS transistor M29 for shunting at an inverter section 24 thereof. A shunt section is comprised by the transistors M28 and M29. Output signal of the Schmitt trigger circuit 22 is input to the inverter 23, and detection signal HS_ENV_OUT is output from the inverter 23. In this respect, the Schmitt trigger circuit 22 comprises one example of a hysteresis buffer section.

Figure 3:
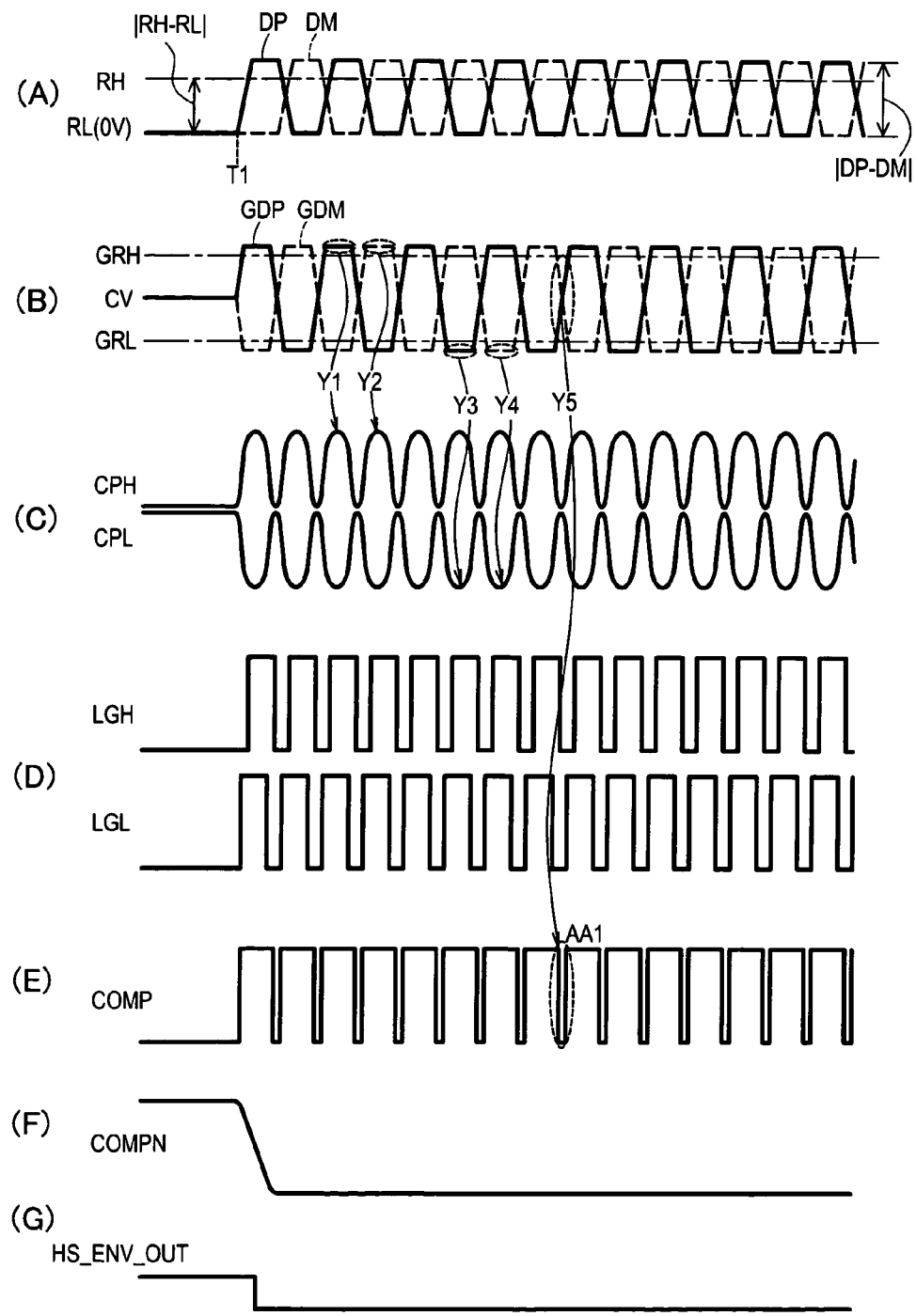
FIG. 3 is a timing chart showing operations of the signal detection circuit directed to the present invention.

Operations of the signal detection circuit according to the present invention of FIG. 2 will now be explained by using the timing chart of FIG. 3. As illustrated in FIG. 3(A), data plus signal DP and data minus signal DM, which are differential input signals, are input to the gates of the transistors M3 and M2 (FIG. 2). The high reference voltage RH and low reference voltage RL of ground level are input to the gates of the transistors M8 and M7. At this point, comparison is directly performed between the amplitude value of the differential input signals (|DP-DM|) and the differential voltage value of the difference reference voltages (|RH-RL|), and when the amplitude value of the differential input signals is larger than the differential voltage value of the differential reference voltages, it is possible to determine that a differential input signal has been input. For instance, when comprising a signal detection circuit that conforms with, for instance, a USB 2.0 standard, it is possible to perform signal detection of differential input signals in conformity with the USB 2.0 standard by setting a value that satisfies differential voltage value of differential reference voltages |RH-RL|<150 mV provided that a standard value for the amplitude value of differential input signals |DP-DM|≧150 mV. However, for enabling stable comparison operations also in the presence of fluctuations in voltage levels of differential input signals or differential reference voltages, the following signal detection operations are performed.

When input of data plus signal DP and data minus signal DM to the signal detection circuit 4 is started at time T1, the data plus signal DP and data minus signal DM are differential-amplified by the differential amplifier 10, and amplified data plus signal GDP and amplified data minus signal GDM having symmetric waveforms with respect to central voltage value CV as illustrated in FIG. 3(B) can be obtained. The high reference voltage RH and low reference voltage RL are differential-amplified by the differential amplifier 11 to become amplified high reference voltages GRH and amplified low reference voltage GRL that are symmetric with respect to the central voltage value CV as illustrated in FIG. 3(B). Here, since the differential amplifier 10 and the differential amplifier 11 are amplifiers that are comprised of transistors of completely identical sizes and that are of identical circuit structures, the central value of the amplified data plus signal GDP and amplified data minus signal GDM and the central value of the amplified high reference voltage GRH and amplified low reference voltage GRL are defined to be the same central voltage value CV. More particularly, by respectively differential-amplifying the differential input signals and differential reference voltages by amplifiers of the same structure, the central voltage value CV of both can be made identical also in the presence of fluctuations in input levels of such differential input signals and differential reference voltages so that it is possible to reliably perform comparison operations and signal detection operations.

Comparison between the voltage values of the amplified data plus signal GDP and the amplified data minus signal GDM and the amplified high reference voltage GRH is performed in the comparator 12 while comparison between the voltage values of the amplified data plus signal GDP and the amplified data minus signal GDM and the amplified low reference voltage GRL is performed in the comparator 13, respectively. As illustrated in FIG. 3(C), comparison result signal CPH of high level is output from the comparator 12 during a period in which the amplified data plus signal GDP is higher than the amplified high reference voltage GRH (arrow Y1) and during a period in which the amplified data minus signal GDM is higher than the amplified high reference voltage GRH (arrow Y2). In other words, during periods in which at least one of the amplified data plus signal GDP and amplified data minus signal GDM is higher than the amplified high reference voltage GRH, high level comparison result signal CPH is output from the comparator 12 through the node N6.

Comparison result signal CPL of low level is output from the comparator 13 during a period in which the amplified data plus signal GDP is lower than the amplified low reference voltage GRL (arrow Y3) and during a period in which the amplified data minus signal GDM is lower than the amplified low reference voltage GPL (arrow Y4). In other words, during periods in which at least one of the amplified data plus signal GDP and amplified data minus signal GDM is lower than the amplified low reference voltage GRL, low level comparison result signal CPL is output from the comparator 13 through the node N8.

The comparison result signal CPH and comparison result signal CPL are input to the signal conversion section 16. In the buffers 18, 19 provided in the signal conversion section 16, the comparison result signals CPH and CPL having analogous waveforms (FIG. 3(C)) are wave-shaped to become logic signals LGH and LGL (FIG. 3(D)). The logic signals LGH and LGL are input to the OR gate 20 for synthesizing signals. Comparison signal COMP is then output from the OR gate 20 (FIG. 3(E)). The comparison signal COMP includes a plurality of regions AA1 in which signal levels change to low level in correspondence to portions of cross points of the amplified data plus signal GDP and amplified data minus signal GDM (arrow Y5). Such regions will become noises. The comparison signal COMP is input to a gate of the NMOS transistor M30 that is provided in the integration circuit 21 of the output section 3.

In the integration circuit 21, integration of the comparison signal COMP is performed for performing noise eliminating operations. A case in which the constant current source CC2 generates current that is larger than that of the constant current source CC1 in the integration circuit 21 will now be explained. During a period in which the input comparison signal COMP is of high level, the NMOS transistor M30 will be in a conducted condition so that a current bus is formed from the power source VDD to the power source VSS through the constant current source CC1, the node N10 and the constant current source CC2. At this time, since the current of the constant current source CC2 is larger, the capacitor CN1 will be in a charged and the capacitor CN2 in a discharged condition so that the voltage of the node N11 is maintained at low level. On the other hand, during a period in which the input comparison signal COMP is of low level, the NMOS transistor M30 will be in a non-conducted condition so that a current bus is formed from the power source VDD to the power source VSS through the constant current source CC1, the nodes N10, N11, and the capacitor CN2. Accordingly, the capacitor CN1 will be in a discharged and the capacitor CN2 in a charged condition so that the voltage of the node N11 will be increased, but by adjusting the capacities of the capacitors CN1, CN2 and by optimizing the time constant, the node N11 may be maintained at a theoretical low level until the NMOS transistor M30 again comes to a conducted condition. The voltage value of the node N11 is output as integrated comparison signal COMPN. With this arrangement, it will be possible to obtain integrated comparison signal COMPN in which the theoretical low level is maintained without being affected by fluctuations in voltages owing to influences of cross points of differential input signals as illustrated in FIG. 3(F). In other words, the integration operation circuit 21 performs operations of a low pass filter in which noise signals occurring in the input signals in a pulse-like manner in a short time are eliminated.

The integrated comparison signal COMPN is input to the Schmitt trigger circuit 22. The Schmitt trigger circuit 22 is a circuit that exhibits hysteresis characteristics and that is provided for eliminating influences of noise of the integrated comparison signal COMPN and for improving the noise allowance. A case in which low level integrated comparison signal COMPN is input to the Schmitt trigger circuit 22 will now be explained. The condition at this time is such that signal that have been inversed to high level is output from the node N12 of the inverter section 24 and that the NMOS transistor M29 is in a conducted condition through which shunted current is made to flow. Through the shunted current that flows through the transistor M29, the threshold level is pushed up so as to increase the dead band, and since the output signal of the Schmitt trigger circuit 22 will not be inversed also in the event noise signals that are below such threshold level are generated in the integrated comparison signal COMPN, the noise allowance will be increased. Similarly, when high level integrated comparison signal COMPN is input to the Schmitt trigger circuit 22, the threshold level will be pushed down through the shunted current flowing through the PMOS transistor M28 so as to increase the dead band and thus to increase the noise allowance. The output signals of the Schmitt trigger circuit 22 are input to the inverter 23. From the inverter 23, detected signal HS_ENV_OUT in which the output from the Schmitt trigger circuit 22 has been inversed is output (FIG. 3(G)).

Figure 11:
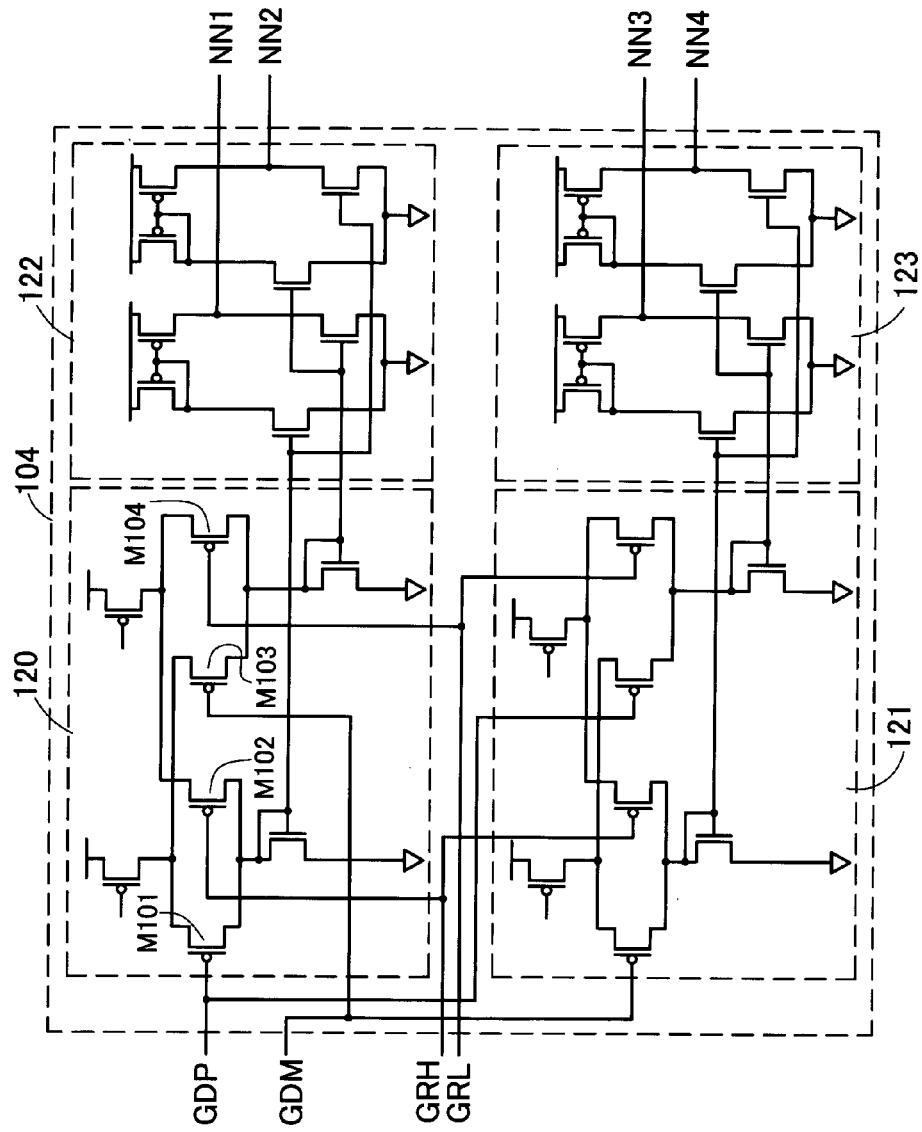
FIG. 11 is a circuit diagram of a conventional Gilbert cell circuit 104.

According to the circuit structure of the first embodiment, it is possible to obtain comparison result signal with a single-staged comparator comprised of the comparator 12 and comparator 13 in the comparator section 2 of the present invention so that the circuit structure can be simplified in contrast to a conventional comparator section that employed a two-staged differential amplifier comprised of the Gilbert cell circuit 104 and the comparator circuit 105 for obtaining comparison result signal. Since the Gilbert cell circuit 104 comprised in the conventional comparator section 102 is provided with a plurality of circuits requiring symmetry of transistors such as current mirrors as illustrated in FIG. 11, it is easily affected by variations in transistor performance so that the performance thereof tends to be degraded while the comparator section 2 of the present invention is of simple circuit structure as illustrated in the comparators 12, 13 of FIG. 2 including a smaller number of transistors requiring symmetry when compared to conventional circuits. It will accordingly be hardly affected by variations in transistor performance and it will be further possible to improve the yield of the present signal detection circuit.

The Gilbert cell circuit 104 (FIG. 11) provided in the comparator section 102 of the conventional signal detection circuit is arranged in that differential voltages are converted into current for addition whereupon it is reconverted into voltage, and since it will take time to perform the conversion between voltage and current, the speed will be limited so that it might happen that the arrangement cannot correspond to differential input signals of high frequency. In contrast thereto, the comparison section 2 of the present invention (FIG. 1) performs comparison operations without performing current addition so that it is possible to secure operation speed, and it will be possible to correspond to differential input signals of high speed and high frequency. Accordingly, amplitudes of input signal voltage can be accurately detected and the presence or absence of input signal can be detected with respect to transmission and receipt of high speed differential input signals that are represented, for instance, by high speed mode (480 Mbps) transfer of USB 2.0 standard.

In the amplifier section 1, which comprises the input stage, differential amplification of the differential input signals and differential reference voltages is performed by using differential amplifiers that are comprised of transistors of completely identical size and of identical circuit structure so that it is possible to make central voltage values after the differential amplification identical. It will also be possible to perform signal detection operations in a stable manner also in case the voltage levels of the data plus signal DP and data minus signal DM fluctuate or in which the voltage levels of the low reference voltage RL and high reference voltage RH fluctuate.

Further, since integration of comparison signal COMP is performed in the integration operation section 17 for eliminating noise, it will be possible to obtain integrated comparison signal COMPN maintained at theoretical low level also in the presence of fluctuations in the voltage owing to influences of cross points of differential input signals, and stable signal detection operations tough against noise can be performed.

The second embodiment of the present invention will now be explained. The second embodiment is arranged in that a rail-to-rail amplifier 30 (FIG. 4) comprised with a control signal generating circuit 31 is employed instead of the differential amplifiers 10 and 11 in the signal detection circuit 4 of the first embodiment as illustrated in FIG. 2. The rail-to-rail amplifier 30 is an amplifier that is capable of setting gains of output voltages Vout1 and Vout2 constant irrespective of fluctuations in central voltages of input signals Vin1 and Vin2. In this respect, data plus signal DP and data minus signal DM or high reference voltage RH and low reference voltage RL are input as the input signals Vin1, Vin2 of the rail-to-rail amplifier 30. Further, amplified data plus signals GDP and amplified data minus signal GDM or amplified high reference voltage GRH and amplified low reference voltage GRL are output as the output signals Vout1, Vout2.

The circuit structure of the rail-to-rail amplifier 30 will now be explained in details. The rail-to-rail amplifier 30 is provided with a differential amplifier 29 and the control signal generating circuit 31. The circuit structure of the differential amplifier 29 will now be explained. A drain of a transistor M36 is connected to sources of transistors M31, M32. A power source VSS is supplied to a source of the transistor M36. Both of sources of the transistors M33, M34 are connected to a drain of transistor M35. A source of the transistor M35 is connected to a power source VDD. A drain of the transistor M33 is connected to a drain and gate of transistor M40, and a source of the transistor M40 is connected to the power source VSS. The transistors M35, M36 perform operations of a constant current source. A drain of the transistor M34 is connected to a drain and gate of transistor M42, and a source of the transistor M42 is connected to the power source VSS. A gate of the NMOS transistor M41 is connected to a gate of transistor M40. A source of the transistor M41 is connected to the power source VSS. A drain of the transistor M41 is connected to a gate of an output transistor M44 and is further connected to its drain through node N20. A drain of the transistor M44 is connected to a drain of the transistor M31, and a source thereof is connected to the power source VDD. A gate of the transistor M43 is connected to the transistor M42. A source of the transistor M43 is connected to the power source VSS.

A drain of the transistor M43 is connected to a gate of the transistor M45 and to its drain through node N21. The drain of transistor M45 is connected to a drain of the transistor M32, and its source to the power source VDD. Transistor M46 is connected in parallel to the transistor M40, and transistor M47 is connected in parallel to the transistor M42. To gates of the transistors M46, M47, control signals CL3, CL4 generated in the control signal generating circuit 31 are input. Operation current Inm1 of the transistor M41 is made to flow to the transistor M44 while operation current Inm2 of the transistor M43 is made to flow to the transistor M45. Output voltages Vout1 and Vout2 are then respectively output from the nodes N20, N21. In this respect, the transistors M31 and M32 comprise a first differential pair, the transistors M33 and M34 a second differential pair, the transistors M40 to M45 a current synthesizing section, and the transistors M46, M47 and the control signal synthesizing circuit 31 a current canceling circuit.

The circuit structure of the control signal generating circuit 31 will now be explained. Sources of NMOS transistors M48, M49 are connected to a drain of transistor M37. The power source VSS is supplied to a source of the transistor M37. The transistor M37 performs operations of a constant current source. Input signal Vin1 is input to a gate of transistor M48, and input signal Vin2 is input to a gate of transistor M49. A drain of the transistor M48 is connected to a drain and gate of a PMOS transistor M50 and also to a gate of a PMOS transistor M52. A drain of a transistor M49 is connected to a drain and gate of a PMOS transistor M51 and is further connected to a gate of a PMOS transistor M54. Sources of the transistors M50 to M54 are connected to the power source VDD. A drain of the transistor M52 is connected to a drain and gate of a NMOS transistor M53, and a drain of the transistor M54 is connected to a drain and gate of a NMOS transistor M55. Sources of the transistors M53 and M55 are connected to the power source VSS. Gates of the transistors M53 and M55 are respectively connected to gates of transistors M46 and M47. Gate voltages of the transistors M53 and M55 are input to gates of transistors M46 and M47 as control signals CL3 and CL4.

Operations of the rail-to-rail amplifier 30 will now be explained. The transistors M48 and M31 are formed to be of identical size, and the current values flowing through the transistors M36 and M37 that operate as current sources are identical. When input signal Vin1 is impressed to gates of the transistors M48 and M31, operation current Inr1 and operation current In1 of identical size are made to flow through the transistors M48 and M31. Since a current mirror circuit is comprised by the transistor M50 and M52, operation current Inr1 identical to that of transistor M48 is made to flow through the transistor M53 on the basis of the operation of the transistor M52. Further, since a current mirror circuit is comprised by the transistors M53 and M46, operation current Inc1 identical to the operation current Inr1 is made to flow through the transistor M46. Similarly, when operation current Inr2 is made to flow through the transistor M49 on the basis of the input signals Vin2, operation current Inc2 identical to the operation current Inr2 is made to flow through the transistor M47 through current mirror operations between the transistors M51 and M54 and current mirror operations between the transistors M55 and M47.

A case in which a central voltage of the input signals Vin1, Vin2 is an intermediate level of the power source VDD and the power source VSS will now be explained. In this case, the transistors M31 and M32, the transistors M33 and M34 and the transistors M48 and M49, which comprise input differential pairs, respectively operate in saturated conditions so that operation currents In1 and In2, operation currents Ip1 and Ip2 and operation currents Inr1 and Inr2 are made to flow. Operation currents Inc1 and Inc2 that are identical to operation currents Inr1 and Inr2 flow through transistors M46 and M47 through the above-described current mirror operations.

While operation currents (Ip1-Inc1), (Ip2-Inc2) will flow through the transistors M40, M42, such operation currents will hardly flow since operation currents Ip1, Ip2 and operation currents Inc1, Inc2 are substantially identical. Accordingly, hardly any operation currents Inm1, Inm2 will flow through the transistors M41, M43 owing to current mirror operations. In other words, operation currents Ip1, Ip2 can be cancelled through operation currents Inr1, Inr2 generated in the control signal generating circuit 31 of the current canceling circuit (transistors M46, M47 and control signal generating circuit 31). Accordingly, operation currents Ip1, Ip2 will not be synthesized to the output currents Io1, Io2 in the current synthesizing section (transistors M40 to M45). As a result, operations of the current synthesizing section will be cancelled through the current canceling circuit so that output currents Io1, Io2 will be operation currents In1, In2.

A case in which the central voltage of the input signals Vin1, Vin2 is higher than the intermediate level of the power source VDD and power source VSS and in which the PMOS transistors M33, M34 operate in a non-saturated region will now be explained. At this time, no operation current Ip1, Ip2 will flow through the transistors M33, M34 so that no operation currents Inm1, Inm2 will flow through the transistors M41, M43, either. In other words, the current canceling circuit (transistors M46, M47 and control signal generating circuit 31) and the current synthesizing section (transistors M40 to M45) will not operate. The output currents Io1, Io2 will accordingly be defined as the operation currents In1, In2.

A case in which the central voltage of the input signals Vin1, Vin2 is lower than the intermediate level of the power source VDD and power source VSS and in which the NMOS transistors M31, M32, M48 and M49 operate in a non-saturated region will now be explained. At this time, no operation current Inr1, Inr2 will flow so that no operation currents Inc1, Inc2 will flow, either.

However, the PMOS transistors M33, M34 will operate in a saturated region so that operation currents Ip1, Ip2 are made to flow. Accordingly, operation currents Inm1, Inm2 identical to the operation currents Ip1, Ip2 will flow through the transistors M41, M43 through current mirror operations. Further, since the NMOS transistors M31, M32 operate in a non-saturated region, the output currents Io1, Io2 will be identical to the operation currents Inm1, Inm2. In other words, while the current canceling circuit (transistors M46, M47 and control signal generating circuit 31) does not operate, the current synthesizing section (transistors M40 to M45) will operate to thus define the output currents Io1, Io2 as operation currents Ip1, Ip2.

A conventional rail-to-rail amplifier will here be considered for purpose of comparison. A conventional rail-to-rail amplifier may be a structure corresponding to the circuit of FIG. 4 but without the control signal generating circuit 31 and the transistors M46, M47. In such a conventional rail-to-rail amplifier, when the central voltage of the input signals Vin1, Vin2 is lower than the intermediate level of the power source VDD and the power source VSS, the NMOS transistors M31, M32 will operate in a non-saturated region, and the output currents Io1, Io2 will be substantially identical to the operation currents Ip1, Ip2. When the central voltage of the input signals Vin1, Vin2 is higher than the intermediate level of the power source VDD and the power source VSS, the PMOS transistors M33, M34 will operate in a non-saturated region, and the output currents Io1, Io2 will be substantially identical to the operation currents In1, In2. However, when the central voltage of the input signals Vin1, Vin2 is proximate of the intermediate level of the power source VDD and the power source VSS, all of the transistors M31, M32, M33 and M34 will be maintained in the saturated region, and the output current Io1 will be a sum of the operation currents In1 and Inm1 (that is, Ip1) and the output current Io2 will be the sum of operation currents In2 and Inm2 (that is, Ip2). The values of the output currents Io1, Io2 will accordingly fluctuate among cases in which the central voltage of the input signals Vin1, Vin2 is of intermediate level of the power source VDD and the power source VSS, of high level and of low level. This will lead to a drawback in that gains of the output voltages Vout1, Vout2 will fluctuate.

Figure 4:
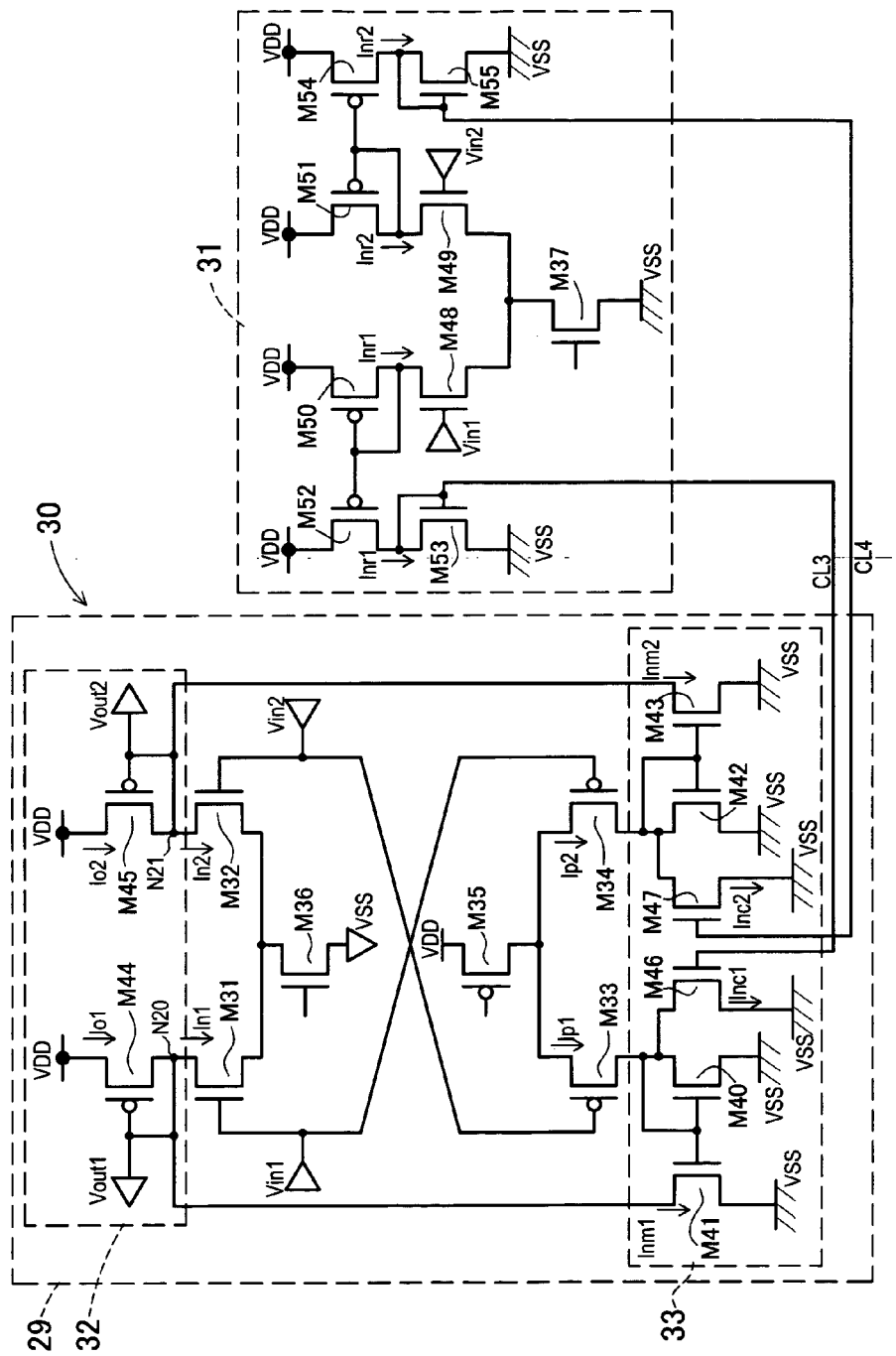
FIG. 4 is a circuit diagram of a rail-to-rail amplifier 30.

However, the rail-to-rail amplifier 30 of FIG. 4 that is employed in the present invention is arranged in that when the central voltage of the input signals Vin1, Vin2 is of intermediate level of the power source VDD and power source VSS, the operation currents Ip1, Ip2 flowing through the transistors M33, M34 will be canceled by the operation currents Inc1, Inc2 generated by the control signal generating circuit 31 so that the output currents Io1, Io2 will be substantially identical to the operation currents In1, In2. It is accordingly possible to prevent cases in which values of the output currents Io1, Io2 largely fluctuate depending on whether the central voltage of the input signals Vin1, Vin2 is of intermediate level of the power source VDD and power source VSS, of high level or of low level, and it is possible to restrict fluctuations in gains of the output voltages Vout1, Vout2. With this arrangement, gains of the output voltages Vout1, Vout2 can be made constant irrespective of fluctuations in the voltages of the input signals Vin1, Vins2 through the rail-to-rail amplifier 30 of the present invention so that it will be possible to perform stable signal detection.

Figure 5:
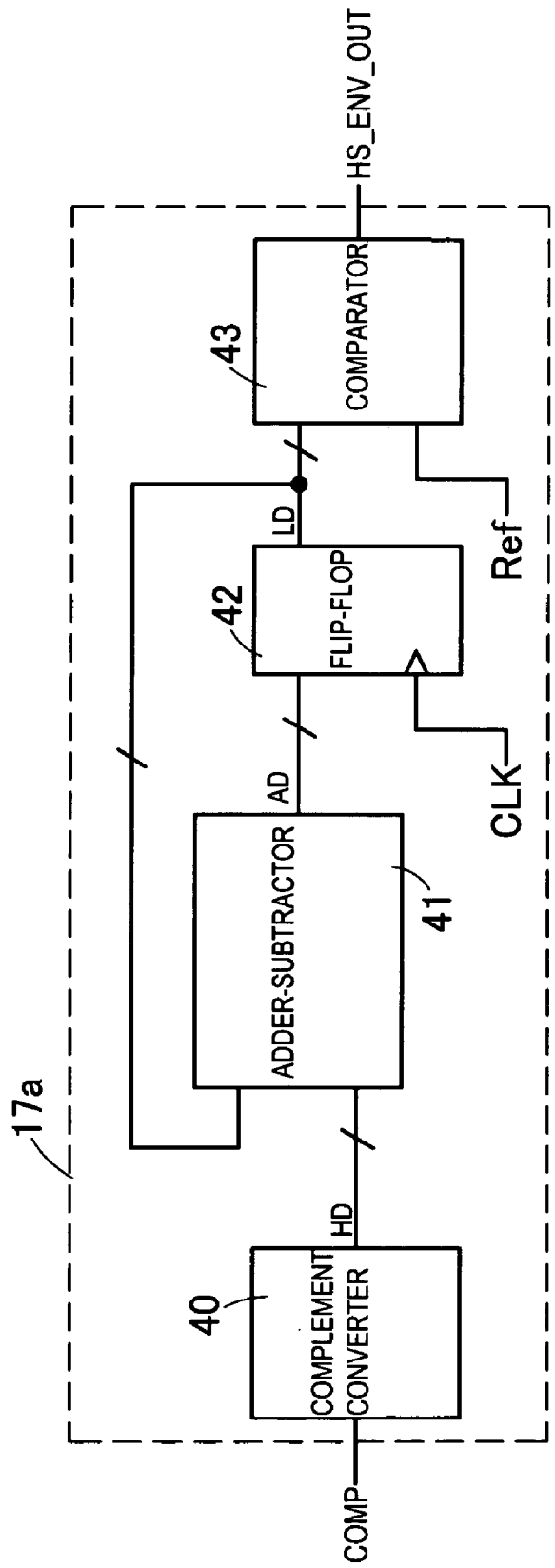
FIG. 5 is a diagram of an integration operation section 17a directed to a third embodiment.

The third embodiment of the present invention will now be explained by using FIGS. 5 to 7. The third embodiment is arranged in that the circuit of the output section 3 has been modified. An integration operation section 17a that is employed as a first specific example is illustrated in FIG. 5. The integration operation section 17a is comprised with a complement converter 40, an adder-subtractor 41, a flip-flop 42 and a comparator 43. Comparison signal COMP is input to the complement converter 40. Complement data HD output from the complement converter 40 are input to the adder-subtractor 41, and add-subtract data AD are output from the adder-subtractor 41. To the flip-flop 42, add-subtract data AD and clock signal CLK is input, and add-subtract data AD are latched as latch data LD. Latch data LD output from the flip-flop 42 are input to the adder-subtractor 41 to comprise a feedback circuit. The latch data LD and reference value Ref are input to the comparator 43. Detection signal HS_ENV_OUT is output from the comparator 43.

In the complement converter 40, operations of converting comparison signal COMP into complements of 2 expressed by 4 bits are performed. The comparison signal COMP is sampled at specified cycles for determining high/low level. Comparison signal COMP of high level correspond to "+1" in a decimal notation, and "+1" is converted into "1111" as a complement of 2 in a 4-bit expression of the binary notation. Comparison signals of low level correspond to "−1" in the decimal notation, and "−1" is converted into "0001" as a complement of 2 in the 4-bit expression of the binary notation. Data after conversion are output from the complement converter 40 as complement data HD.

In the adder-subtractor 41, complement data HD output from the complement converter 40 and latch data LD fed back from the flip-flop 42 are added or subtracted. In this respect, since complement data HD and latch data LD are complements of 2, it is possible to perform both of addition and subtraction through adding operations. "+1" and "−1" of the complement data HD are added in a cumulative manner through feedback to become add-subtract data AD. Accordingly, whether the add-subtract data HD are positive or negative is determined by the ratio between "+1" and "−1" of the complement data HD. In other words, the higher the ratio of high level becomes in the comparison signals COMP, the larger will the add-subtract data AD become in the positive direction while the higher the ratio of low level becomes, the larger will the add-subtract data AD become in the negative direction.

Each time an updated piece of add-subtract data AD is input from the adder-subtractor 41, the flip-flop 42 performs operations of latching the add-subtract data AD in accordance with clock signals CLK. The latched data are fed back to the adder-subtractor 41 as latch data LD and are further input to the comparator 43.

In the comparator 43, comparison of the latch data LD and a reference value Ref is performed. For instance, when the reference value Ref is "0", low level signal is output from the comparator 43 when values of the latch data LD are not less than 0, and when values of the latch data LD are smaller than 0, high level signal is output from the comparator 43. By way of example, a case in which comparison signal COMP including a plurality of regions AA1 that correspond to pulse-like noise signals affected by cross points of differential input signals (FIG. 3(E)) are input to the integration operation section 17a will now be explained. The comparison signal COMP of FIG. 3(E)) is a signal with a higher ratio of high level periods when compared to low level periods such as regions AA1. Accordingly, the number of "−1" of complement data HD input to the adder-subtractor 41 is larger than that of "+1" so that the latch data LD will become larger in the positive direction through feedback. Accordingly, latch data LD not less than 0 are continuously input to the comparator 43 so that low level signal is continuously output from the comparator 43. In other words, detection signal HS_ENV_OUT maintained at theoretical low level without being affected by fluctuations in voltages owing to influences of cross points are output from the comparator 43. Similarly, when the number of "+1" of complement data input to the adder-subtractor 41 is less than that of "−1", detection signal HS_ENV_OUT maintained at theoretical low level is output from the comparator 43. With this arrangement, it can be understood that by performing integration operations through a circuit of the integration operation section 17a, it is possible to perform operations of a low pass filter for eliminating noise signals generated in the differential input signals in a pulse-like manner in a short time and to eliminate influences of fluctuations in voltages owing to cross points of differential input signals.

In this respect, the complement of 2 that is converted in the complement converter 40 is not limited to 4 bits. It will be of advantage that reversal of signs of the topmost bit owing to carrying of the latch data LD is less apt to occur the larger the number of bit becomes. For instance, when sign reversal presenting operations of the topmost bit owing to carrying are performed at specified cycles, it will be of advantage that operation cycles can be prolonged the larger the number of bits becomes. The reference value Ref is not limited to "0", either, and it may be set to meet standards of circuits. The larger the reference value Ref is set in the negative direction, the less it is apt to be affected by noise also when the ratio of "−1" of the complement data HD becomes higher (when the ratio of noise with respect to input signals becomes higher).

Figure 6:
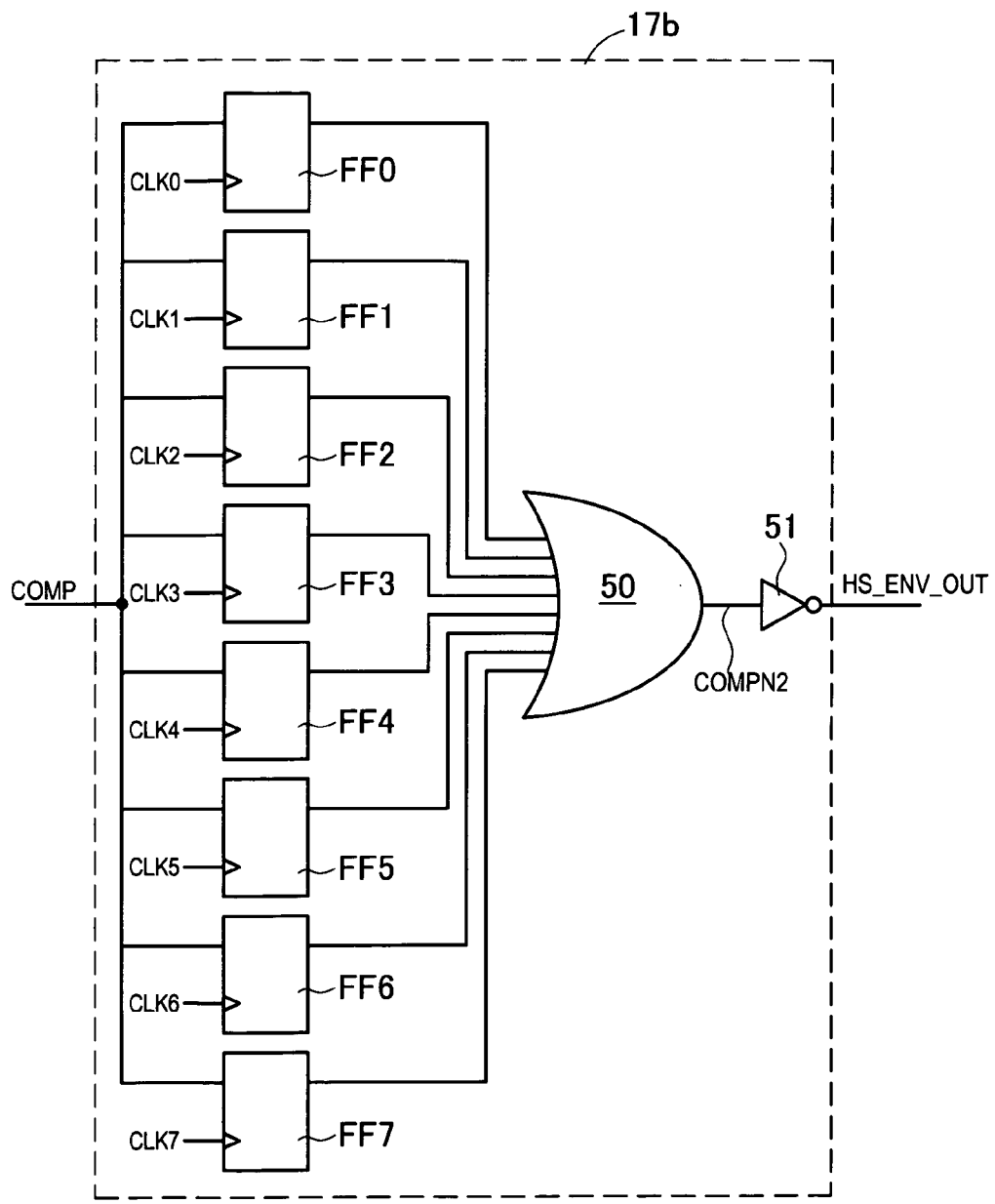
FIG. 6 is a diagram of an integration operation section 17b directed to the third embodiment.
Figure 7:
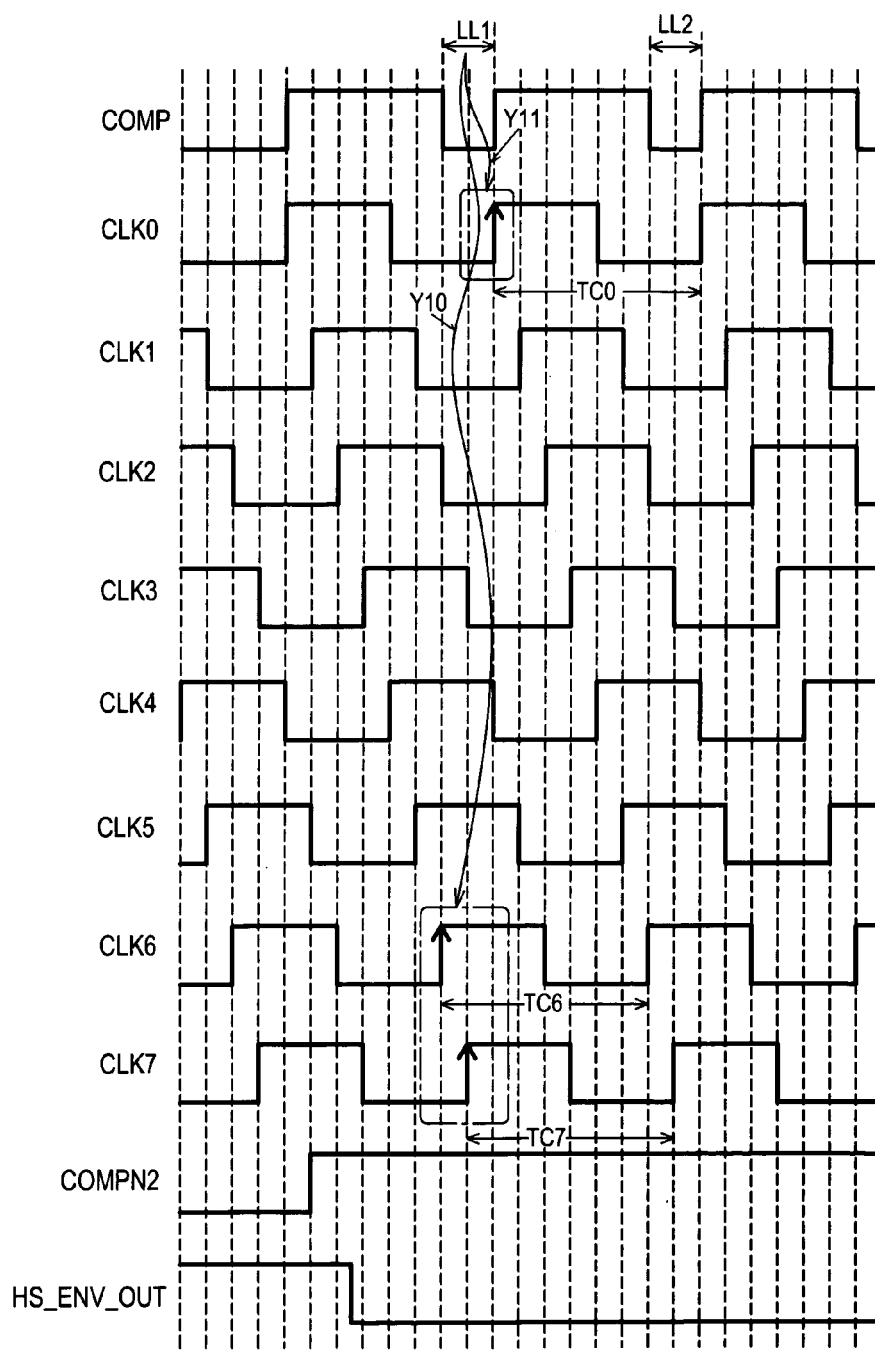
FIG. 7 is a timing chart for illustrating operations of the integration operation section 17b directed to the third embodiment.

An integration operation section 17b is illustrated in FIG. 6 as a second specific example. The integration operation section 17b is provided with D flip-flops FF0 to FF7, an OR gate 50 and an inverter 51. To the D flip-flops FF0 to FF7, comparison signal COMP and 8-phased clock signals CLK0 to CLK7 are input. Output ends of the D flip-flops FF0 to FF7 are connected to an input end of the OR gate 50. Integrated comparison signal COMPN2 output from the OR gate 50 is input to the inverter 51, and HS_ENV_OUT is output from the inverter 51.

Operations of the integration operation section 17b will now be explained by using the timing chart of FIG. 7. Periods LL1 and LL2 of the comparison signal COMP is a period during which the signal is of low level owing to influences of cross points of differential input signals. In this respect, the comparison signals COMP of FIG. 7 has waveforms of a worst case in which it is mostly affected by cross points. The D flip-flops FF0 to FF7 take in comparison signal COMP at rise edges of the clock signals CLK0 to CLK7 and output the taken in signals. Rise edges of the clock signals CLK6, CLK7 and CLK0 exist during period LL1 (arrows Y10, Y11) so that low level comparison signal COMP is taken it to the D flip-flops FF6, FF7 and FF0 and output therefrom. On the other hand, high level comparison signal COMP is taken it at rise edges of clock signals CLK1 to CLK5 and output therefrom. By obtaining a logic sum of output signals from the D flip-flops FF0 to FF7 at the OR gate 50 (FIG. 6), influences of low level signals output from the D flip-flops FF6, FF7 and FF0 at output periods TC6, TC7 and TC0 are cancelled. Accordingly, influences of low level signals on comparison signal COMP during period LL1 and LL2 are cancelled at the OR gate 50, and it is prevented that influences thereof appear in the integrated comparison signal COMPN2. Upon inputting the integrated comparison signal COMPN2 to the inverter 51 for inversion, it is output as detection signal HS_ENV_OUT from the inverter 51.

By providing the integration operation section 17b, it will be possible to obtain detection signal HS_ENV_OUT maintained at theoretical low level without being affected by fluctuations in voltages owing to influences of cross points of differential input signals such as in periods LL1 and LL2.

As it is evident from the above, according to the signal detection circuit and the signal detection method of the present invention, even though voltage levels of input differential input signals and differential reference voltages fluctuate, by performing differential amplification thereof, it is possible to perform comparison operations in a condition in which the central voltage value CV is identical at a point of time at which both are compared in the comparator section 2 so that it is possible to eliminate influences of fluctuations in input levels at the time of input. Accordingly, signal detection operations can be stably and reliably performed.

Also in case one of the comparator 12 and the comparator 13 are provided in the comparator section 2, it is possible to detect presence or absence of differential input signals upon performing comparison operations, wherein such a case will be advantaged in that simplification of the circuit of the comparator section 2 can be achieved.

In contrast to a conventional circuit represented by a Gilbert cell circuit that required a two-staged structure comprised of a differential amplifier and a comparator, the comparator section 2 of the present invention is capable of performing comparison and detection operations with a single-staged circuit structure including the comparator 12 and the comparator 13, and it is accordingly possible to simplify the circuit structure. Since circuits requiring symmetry of transistors can accordingly be reduced, it is hardly affected by influences of variations in transistor performances and it will be possible to improve the yield of the present signal detection circuit 4.

Since the operation speed can be secured in the circuit of the present invention by avoiding current addition and by reducing the number of stages of the circuit structure, it is possible to correspond to differential input signals of high speed and high frequency. It is therefore possible to detect the presence or absence of differential input signals of high speed in conformity to USB 2.0 standard and thus to form data receivers or similar that correspond to USB 2.0 standard.

By the provision of the rail-to-rail amplifier 30 in the second embodiment, it is possible to prevent increases in the output currents Io1, Io2 through the current canceling circuit (the transistors M46, M47 and the control signal generating circuit 31) also in case both of the first differential pair (transistors M31 and M32) and the second differential pair (transistors M33 and M34) are in operating conditions. It is therefore possible to make the gains of the differential amplifier 10 and the differential amplifier 11 constant irrespective of the input level of the differential input signals and the differential reference voltages, and thus to perform stable signal detection. The differential amplifier 10 and the differential amplifier 11 provided with the rail-to-rail amplifier 30 can perform differential amplification also in correspondence to fluctuations in levels in the differential input signals and differential reference voltages. It is possible to perform differential amplification also in correspondence to cases in which the signal input level to the differential amplifier 10 is high and the signal input level to the differential amplifier 11 is low and vice versa, cases in which the signal input level to the differential amplifier 10 is low and the signal input level to the differential amplifier 11 is high. With this arrangement, differential-amplifying operations can be performed with respect to various input signal levels of the differential input signals and differential reference voltages so that it is possible to reliably perform signal detection operations.

In this respect, the present invention is not limited to the above embodiments, and it goes without saying that various improvements and modifications are possible without parting from the scope of the gist of the present invention. While both differential amplifiers provided in the amplifier section 1, that is, the differential amplifier 10 for differential input signals and the differential amplifier 11 for differential reference voltages are exemplified as to be a rail-to-rail amplifier 30 provided with a N-type control signal generating circuit 31 as illustrated in the second embodiment, the invention is not limited to this. It is also possible to comprise the differential amplifiers 10 and 11 by, for instance, a rail-to-rail amplifier 30p (FIG. 8) comprised with a P-type control signal generating circuit 31p.

Figure 8:
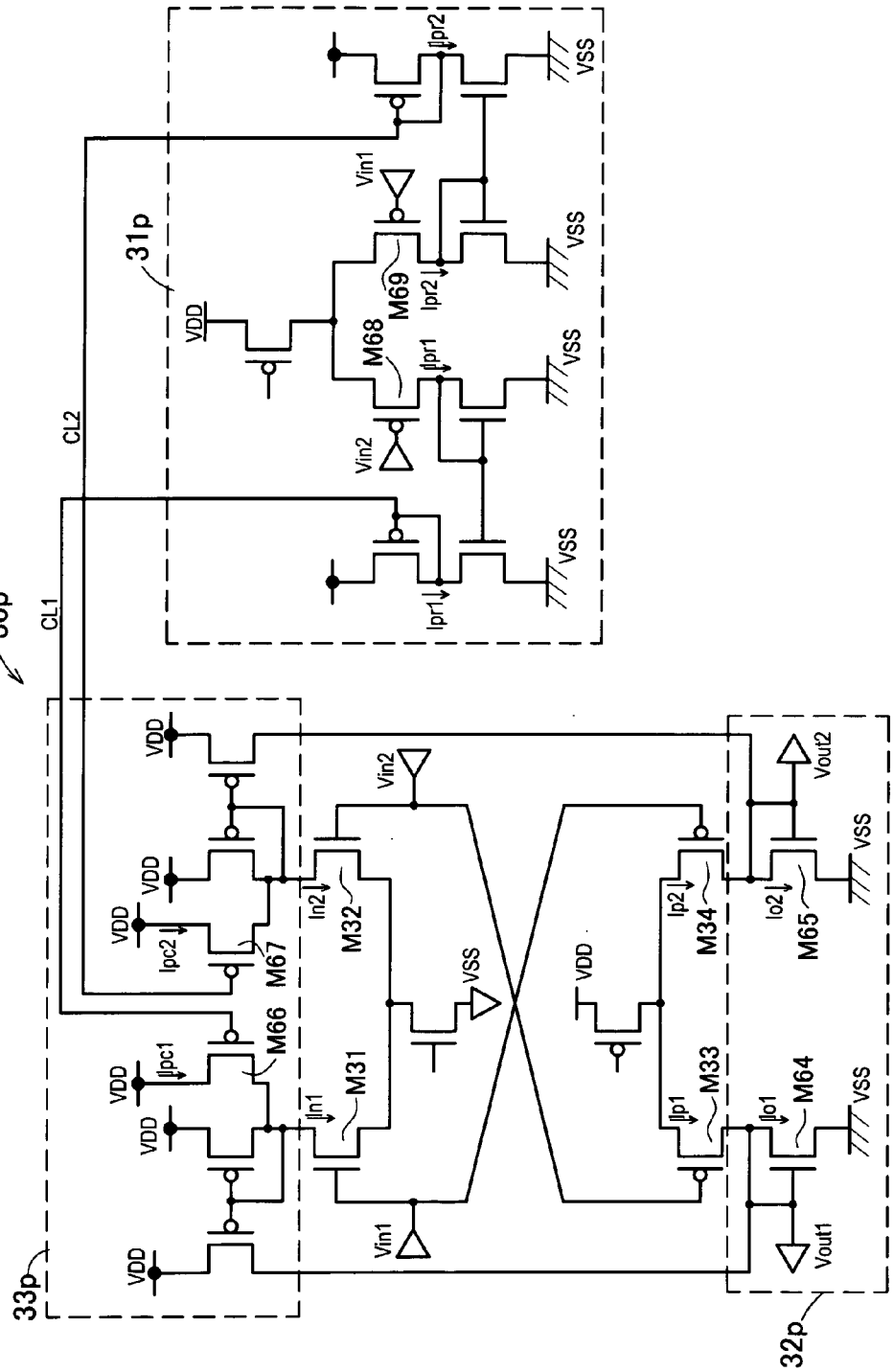
FIG. 8 is a circuit diagram of a rail-to-rail amplifier 30p.

The rail-to-rail amplifier 30p provided with a P-type control signal generating circuit will now be explained by using FIG. 8. The rail-to-rail amplifier 30p is arranged in that it comprises a P-type control signal generating circuit 31p instead of the rail-to-rail amplifier 30 of FIG. 4 provided with a N-type control signal generating circuit 31. The P-type control signal generating circuit 31p (FIG. 8) is arranged in that the order of connection of the respective transistors from power source VDD to power source VSS and the polarity of the respective transistors have been reversed in the circuit of the N-type control signal generating circuit 31 (FIG. 4). Differential output section 32p (FIG. 8) is arranged in that it is connected to the power source VSS upon reversing the connection of the differential output section 32 (FIG. 4) to the power source and the polarity of the transistors, while a canceling section 33p (FIG. 8) is arranged in that it is connected to the power source VDD upon reversing the connection of the canceling section 33 (FIG. 4) to the power source and the polarity of the transistors. Since other structures are identical to those of the rail-to-rail amplifier 30 (FIG. 4), explanations thereof will be omitted.

Operations of the rail-to-rail amplifier 30p will be explained. In this respect, detailed operations are identical to those of the rail-to-rail amplifier 30 (FIG. 4) so that explanations thereof will be omitted. When the central voltage of input signals Vin1, Vin2 is of intermediate level of the power source VDD and power source VSS, and the transistors M31, M32 and the transistors M33, M34 that comprise input differential pairs operate in saturated conditions, transistors M68, M69 will also operate in a saturated condition to make operation currents Ipr1, Ipr2 flow. Operation currents Ipc1, Ipc2 that are identical to the operation currents Ipr1, Ipr2 will then flow through the transistors M66, M67 through current mirror operations. Accordingly, only operation currents Ip1, Ip2 flowing through the transistors M33, M34 will flow as output currents Io1, Io2 through the transistors M64, M65 that generate output voltages Vout1, Vout2. When a central voltage of the input signals Vin1, Vin2, which are complement signals, falls lower than the intermediate level of the power source VDD and the power source VSS, only operation currents Ip1, Ip2 flowing through the transistors M33, M34 will flow through the transistors M64, M65 that generate output voltages Vout1, Vout2 as output currents Io1, Io2. On the other hand, when the central voltage of the input signals Vin1, Vin2 rises higher than the intermediate level of the power source VDD and the power source VSS so that the transistors M33, M34, M68, M69 operate in a non-saturated region, the transistors M31, M32 will operate in a saturated region. In the transistors M64, M65, only current corresponding to the operation currents In1, In2 flowing through the transistors M31, M32 will flow as output currents Io1, Io2. With this arrangement, gains of the output voltages Vout1, Vout2 can be made constant irrespective of fluctuations in the voltage of the input signals Vin1, Vin2 by employing the rail-to-rail amplifier 30 so that it is possible to perform stable signal detection.

Figure 9:
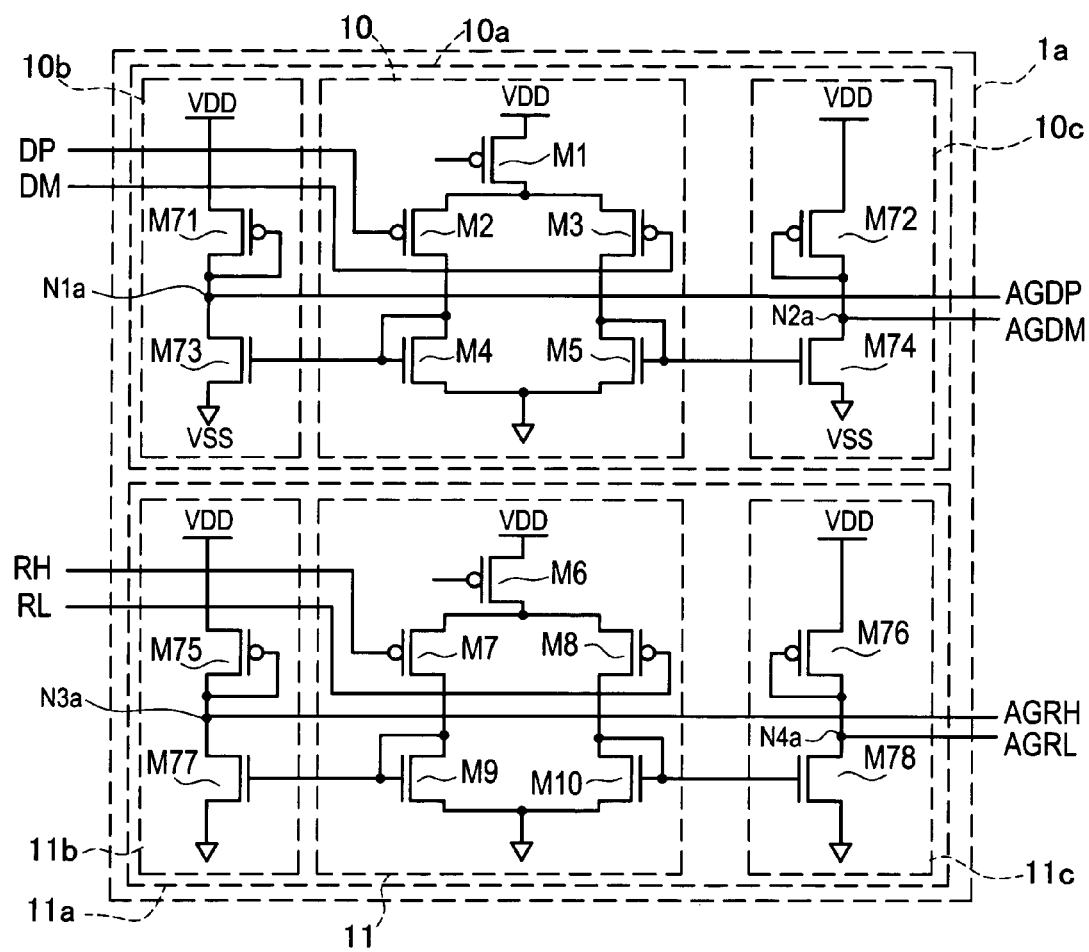
Figure 10:
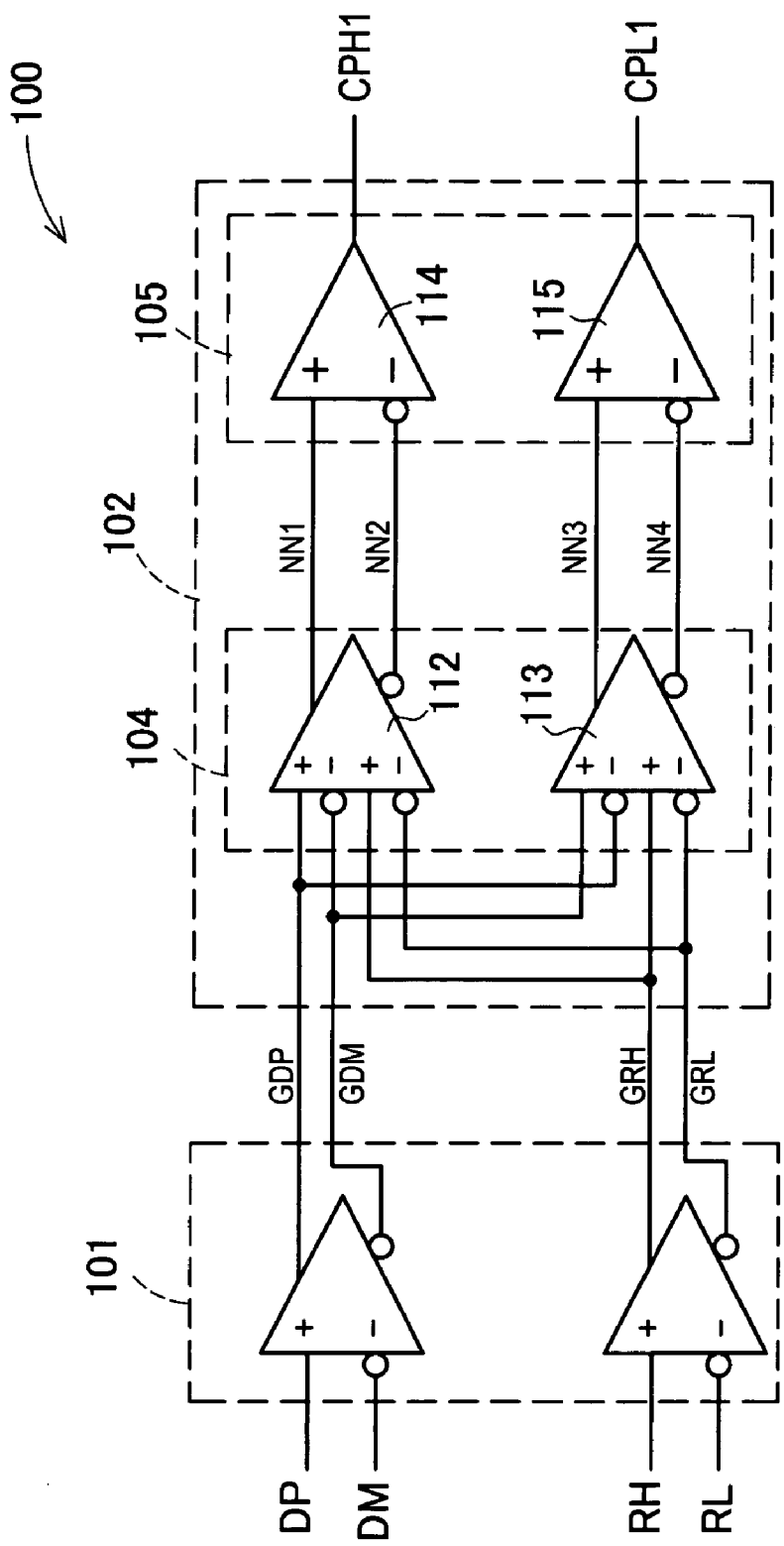
FIG. 10 is a diagram of a conventional comparator section 102.

A case in which a modified amplifier section 1a as illustrated in FIG. 9 is employed instead of the amplifier section 1 as illustrated in FIG. 2 is employed in the first embodiment will now be explained. The amplifier section 1a is provided with differential amplifiers 10a and 11a. The differential amplifier 10a is arranged in that the differential amplifier 10 of the first embodiment is further provided with auxiliary amplifier sections 10b and 10c. In the auxiliary amplifier section 10b, a source of transistor M71 is connected to the power source VDD while a gate and drain thereof is connected to node N1a. A source of an auxiliary amplifying transistor M73 is connected to the power source VSS and a drain thereof to the node N1a. Voltage value of the node N1a is output as enhanced amplified data plus signal AGDP. Similarly to the auxiliary amplifier section 10b, the auxiliary amplifier section 10c is provided with a transistor M72 and an auxiliary amplifying transistor M74, and voltage value of a node N2a is output as enhanced amplified data minus signal AGDM. Transistor sizes of the transistors M73, M74 of the auxiliary amplifier sections 10b and 10c are larger than those of the sizes of the transistors M4, M5 of the differential amplifier 10. In this respect, transistors M71, M72 function as voltage conversion sections for converting amplified currents flowing through the auxiliary amplified transistors M73, M74 into voltages.

Similarly to the structure of the differential amplifier 10a, the differential amplifier 11a is arranged in that auxiliary amplifier sections 11b and 11c are further added to the differential amplifier 11. The auxiliary amplifier section 11b is provided with a transistor M75 and a transistor M77, and voltage value of a node N3a is output as enhanced amplified high reference voltage AGRH. The auxiliary amplifier section 11c is provided with a transistor M76 and a transistor M78, and voltage value of a node N4a is output as enhanced amplified low reference voltage AGRL. Transistor sizes of the transistors M77, M78 of the auxiliary amplifier section 11b and 11c are larger than sizes of the transistors M9, M10 of the differential amplifier 11.

Operations will be explained. Paying attention to the combination of the differential amplifier 10 and the auxiliary amplifier section 10b, the transistor M4, which is a load transistor that is provided in the differential pair of the differential amplifier 10, and the auxiliary amplifier transistor M73 comprise a current mirror circuit achieving current amplification. Since the size of the auxiliary amplifier transistor M73 is set to be larger than the size of the transistor M4, the current flowing through the auxiliary amplifier transistor M73 is set to be larger than the current flowing through the transistor M4. The amplified current is converted from the current to voltage in the transistor M71, and enhanced amplified data plus signal AGDP is output from the node N1a. Similarly paying attention to the combination of the differential amplifier 10 and the auxiliary amplifier section 10c, the transistor M5, which is a load transistor that is provided in the differential pair of the differential amplifier 10, and the auxiliary amplifier transistor M74 comprise a current mirror circuit, and since the size of the auxiliary amplifier transistor M74 is set to be larger than the size of the transistor M5, the current flowing through the auxiliary amplifier transistor M74 is set to be larger than the current flowing through the transistor M5. In the transistor M72, the current is converted into voltage, and enhanced amplified data plus signal AGDM is output from the node N2a. With this arrangement, it is possible to further amplify signals differential-amplified by the differential amplifier 10 through the auxiliary amplifier sections 10b, 10c so as to output them as enhanced amplified data plus signal AGDP and enhanced amplified data minus signal AGDM.

Similarly thereto, the current flowing through the transistor M77 is made to be larger than the current flowing through the transistor M9 and the current flowing through the transistor M78 is made to be larger than the current flowing through the transistor M10 also in the combination of the differential amplifier 11, and the auxiliary amplifier section 11b and the auxiliary amplifier section 11c. With this arrangement, the signals that have been amplified by the differential amplifier 11 can be further amplified, and enhanced amplified high reference voltage AGRH and enhanced amplified low reference voltage AGRL are respectively output from the nodes N3a, N4a.

The enhanced amplified data plus signal AGDP, the enhanced amplified data minus signal AGDM, the enhanced amplified high reference voltage AGRH and the enhanced amplified low reference voltage AGRL are input to the comparator section 2 of the next stage (FIG. 2) in which comparison operations are performed. In the comparator 12, comparison of the enhanced amplified high reference voltage AGRH with the enhanced amplified data plus signal AGDP and the enhanced amplified data minus signal AGDM is performed instead of the comparison between the amplified high reference voltage GRH with the amplified data plus signal GDP and the amplified data minus signal GDM. Accordingly, comparison is performed between amplified signals so that differential voltages values of both will become larger, and signal comparison operations can be more reliably and more rapidly be performed. Similarly, in the comparator 13, comparison of the enhanced amplified low reference voltage AGRL with the enhanced amplified data plus signal AGDP and the enhanced amplified data minus signal AGDM is performed so that the differential voltages values of both will become larger, and signal comparison operations can be more reliably and more rapidly be performed. With this arrangement, the reliability and response of signal detection operation of the signal detection circuit 4 can be further improved.

While both of the differential amplifiers 10, 11 have been comprised of P-type differential amplifiers comprised with PMOS transistor differential pairs in the first embodiment, the present invention is not limited to this arrangement. For instance, when the input signal level of the differential input signals or differential reference voltages is higher than the intermediate level of the power source VDD and the power source VSS, both of the differential amplifiers 10 and 11 of the amplifier section 1 may be comprised by N-type differential amplifiers. With this arrangement, it will be possible to correspond by changing the differential amplifiers in accordance to the heights of the input signal levels of the differential input signals and differential reference voltages, and differential-amplifying operations of the amplifier section 1 can be reliably performed.

The two comparators 12 and 13 provided in the comparator section 2 have been illustrated in FIG. 2 of the first embodiment as those in which a N-type comparator is employed as the comparator 12 and a P-type comparator as the comparator 13, but the present invention is not limited to this arrangement. It goes without saying that the comparator 12 and the comparator 13 of the comparator section 2 can be arranged of an arbitrary combination of N-type comparators and P-type comparators. In this case, the combination of the N-type comparator and the P-type comparator in the comparator section 2 is defined by the input level of input signals that are input from the amplifier section 1. For instance, where the level of input signals of the amplified data plus signal GDP, the amplified data minus signal GDM, the amplified high reference voltage GRH and the amplified low reference voltage GRL is generally lower than the intermediate level of the current voltages, P-type comparators shall be employed as the comparators 12 and 13 while when the level of input signals is generally high, N-type comparators shall be employed as the comparators 12 and 13. Where the level input signals to the comparator section 2 is proximate of the intermediate level of the power source VDD and the power source VSS, a N-type comparator shall be employed as the comparator 12 while a P-type comparator shall be employed as the comparator 13.

From the above, it is possible to comprise a signal detection circuit that is capable of performing reliable signal detection operations for various kinds of input signal levels of the differential input signals and differential reference voltages by changing the type of differential amplifiers provided in the amplifier section 1 in accordance with input signal level of differential input signals and differential reference voltages input to the amplifier section 1 and by further making the conductive type of the comparators 12 and 13 correspond in accordance with input signal level that is input from the amplifier section 1 to the comparator section 2. Further, differential amplifiers applicable as the differential amplifiers 10 and 11 of the amplifier section 1 can be selected from the following four types (N-type differential amplifier, P-type differential amplifier, rail-to-rail amplifier 30 provided with a N-type control signal generating circuit 31 and rail-to-rail amplifier 30p provided with a P-type control signal generating circuit 31p), and comparators applicable as the comparators 12 and 13 of the comparator section 2 can be selected from the following four combinations in accordance with output levels of the amplifier section 1 (in which the comparators 12 and 13 are comprised of N-N type comparators, P-P type comparators, P-N type comparators or N-P type comparators). Accordingly, a total of 16 combinations exist for the combination of the circuit structure of the amplifier section 1 and the comparator section 2, and it is possible to select an optimal one from these combinations.

While FIG. 2 of the first embodiment has been illustrated in that two comparators, namely comparators 12 and 13 are provided in the comparator section 2, the present invention is not limited to this embodiment, and it will be suffice if at least one of these comparators is provided in the comparator section 2. For instance, it is possible to arrange the signal detection circuit as a structure in which only the comparator 12 is provided in the comparator section 2 in which outputs of the comparator 12 are output as logic signal LGH through the buffer 18 whereupon the logic signal LGH is calculated in the integration operation section 17 for obtaining detection signal HS_ENV_OUT. On the contrary, it is also possible to arrange a signal detection circuit as a structure in which only the comparator 13 is provided in the comparator section 2 and in which logic signal LGH is calculated in the integration operation section 17 for obtaining detection signal HS_ENV_OUT. With this arrangement, it is possible to simplify the circuit structure of the comparator section 2 and to omit the OR gate 20 for synthesizing signals, and thus to achieve reduction of circuit area.

While the low reference voltage RL has been defined to be of ground level in the first embodiment, the present invention is not limited to this but may be of specified voltage value.

In this respect, the transistor M15 illustrates one example of a first transistor, the transistors M13 and M14 examples of second and third transistors, the transistor M20 one example of a fourth transistor, the transistors M18 and M19 examples of fifth and six transistors, the OR gate 20 one example of a logic operation section and the inverter section 24 one example of a NOT operation section.

According to the signal detection circuit and the signal detection method of the present invention, it is possible to simplify the circuit structure of the comparator section so that it is hardly affected by variations in transistor performances to thereby enable improvements in the yield of the present signal detection circuit. Since it is possible to secure operation speed, it is possible to correspond to differential input signals of high speed and high frequency. By employing differential amplifiers of identical circuit structures, it is possible to make central voltage values of differential input signals after differential amplification identical to central voltage values of differential reference voltages after differential amplification so that comparison operations can be stably performed also in case voltage level of differential input signals and differential reference voltages fluctuate, and signal detection operations can be reliably performed.

What is claimed is:

1. A signal detection circuit, the signal detection circuit being for detecting presence or absence of input of differential input signals, comprising:
   an amplifier section comprising:
      a first differential-amplifying circuit which differential-amplifies a high reference voltage signal and a low reference voltage signal to output an amplified high reference voltage signal and an amplified low reference voltage signal; and
      a second differential-amplifying circuit which differential-amplifies differential input signals to output differential output signals, and
   a comparator section provided with at least either one of a first comparator circuit including three inputs for performing simultaneous detection, that upon input of the amplified high reference voltage signal and the differential output signals, at least either one of the differential output signals is higher than the amplified high reference voltage signal, and a second comparator circuit for performing detection, that upon input of the amplified low reference voltage signal and the differential output signals, at least either one of the differential output signals is lower than the amplified low reference voltage signal.

2. The signal detection circuit as claimed in claim 1, wherein
   the first comparator circuit comprises a differential pair comprised by a first transistor to which the high reference voltage is input and second and third transistors to which the differential input signals are input,
   wherein the second comparator circuit comprises a differential pair comprised by a fourth transistor to which the low reference voltage is input and fifth and six transistors to which the differential input signals are input, and
   wherein the first to six transistors are of identical size.

3. The signal detection circuit as claimed in claim 1, wherein the amplifier section comprises an auxiliary amplifier section provided with
   auxiliary amplifier transistors comprising a current mirror section for current amplification for each load transistor provided in the differential pair of the amplifier section, and
   a voltage conversion section for converting current flowing through the auxiliary amplifier transistors into voltages.

4. The signal detection circuit as claimed in claim 1, wherein the amplifier section comprises a rail-to-rail amplifier including
   a first differential pair comprised of NMOS transistors to which the differential input signals or the differential reference voltages are input,
   a second differential pair comprised of PMOS transistors to which the differential input signals or the differential reference voltages are input,
   a current synthesizing section for synthesizing synthesized currents upon synthesizing operation currents of the first differential pair and the second differential pair, and
   a current canceling circuit for canceling current corresponding to at least either one operation current of the first differential pair or the second differential pair from the synthesized current when both of the first differential pair and the second differential pair operate in a saturated region.

5. The signal detection circuit as claimed in claim 1, comprising an output section including an integration circuit for integrating signal output from the comparator section and a hysteresis buffer section that is serially connected to the integration circuit and having hysteresis characteristics for eliminating noise existing in signal output from the integrated circuit.

6. The signal detection circuit as claimed in claim 5, wherein the output section is provided with a logic sum operation section to which output signal of the first comparator section and output signal of the second comparator section are input.

7. The signal detection circuit as claimed in claim 5, wherein the hysteresis buffer section includes
   a NOT operation section to which output signal of the integration circuit is input, and
   a shunt section for bypassing current flowing through a NMOS transistor provided in the NOT operation section when signal input to the NOT operation section is of low level and for bypassing current flowing through a PMOS transistor provided in the NOT operation section when signal input to the NOT operation section is of high level.

8. The signal detection circuit as claimed in claim 1, wherein the differential input signals are signals in conformity with USB (Universal Serial Bus) standards.

9. A signal detection method, the signal detection method being for detecting presence or absence of input of differential input signals, including the steps of:
   performing differential amplification of a high reference voltage signal and a low reference voltage signal to output an amplified high reference voltage signal and an amplified low reference voltage signal;
   performing differential amplification of differential input signals to output two differential output signals;
   performing at least one of simultaneous detection that at least either one of the differential output signals is higher than the amplified high reference voltage signal by comparing the amplified high reference voltage signal with each of the two differential output signals, and detection that at least either one of the differential output signals is lower than the amplified low reference voltage signal by comparing the amplified low reference voltage signal with each of the two differential output signals.

* * * * *